US011747416B1

(12) United States Patent
Stormont et al.

(10) Patent No.: US 11,747,416 B1
(45) Date of Patent: Sep. 5, 2023

(54) SYSTEM AND METHOD FOR STABILIZING SURFACE COIL

(71) Applicant: GE Precision Healthcare LLC, Wauwatosa, WI (US)

(72) Inventors: Robert Steven Stormont, Hartland, WI (US); Victor Taracila, Beachwood, OH (US); Fraser John Laing Robb, Aurora, OH (US); Thomas Grafendorfer, Mill Valley, CA (US); Louis Jay Vannatta, Crystal Lake, IL (US); Yun-Jeong Stickle, Solon, OH (US)

(73) Assignee: GE Precision Healthcare LLC, Wauwatosa, WI (US)

( * ) Notice: Subject to any disclaimer, the term of this patent is extended or adjusted under 35 U.S.C. 154(b) by 0 days.

(21) Appl. No.: 17/716,230

(22) Filed: Apr. 8, 2022

(51) Int. Cl.
*G01R 33/36* (2006.01)
(52) U.S. Cl.
CPC ..... *G01R 33/3628* (2013.01); *G01R 33/3621* (2013.01)
(58) Field of Classification Search
None
See application file for complete search history.

(56) References Cited

U.S. PATENT DOCUMENTS

| 5,828,216 A * | 10/1998 | Tschudin | H03G 1/0088 |
| | | | 324/322 |
| 8,791,696 B2 | 7/2014 | Grafendorfer et al. | |
| 9,013,187 B2 | 4/2015 | Stormont | |
| 2017/0003367 A1* | 1/2017 | Chu | G01R 33/34076 |
| 2022/0308137 A1* | 9/2022 | Zeng | H05K 1/165 |

* cited by examiner

Primary Examiner — Douglas X Rodriguez
(74) Attorney, Agent, or Firm — Fletcher Yoder P.C.

(57) ABSTRACT

A preamplifier arrangement for an MRI system includes a preamplifier coupled to a loop of a multi-channel coil array of the MRI system, wherein the preamplifier and the loop are subject to potentially form an unstable system with oscillation at one or more peak frequencies. The preamplifier arrangement also includes an impedance matching network disposed between and coupled to the preamplifier and the loop. The impedance matching network is configured to generate a high blocking impedance. The preamplifier arrangement further includes an input network disposed between and coupled to the preamplifier and the loop. The input network is configured to provide an input to suppress gain at the one or more peak frequencies.

8 Claims, 17 Drawing Sheets

SYSTEM AND METHOD FOR STABILIZING SURFACE COIL

BACKGROUND

The subject matter disclosed herein relates to medical imaging and, more particularly, to stabilizing surface coils in a magnetic resonance imaging (MRI) system.

Non-invasive imaging technologies allow images of the internal structures or features of a patient/object to be obtained without performing an invasive procedure on the patient/object. In particular, such non-invasive imaging technologies rely on various physical principles (such as the differential transmission of X-rays through a target volume, the reflection of acoustic waves within the volume, the paramagnetic properties of different tissues and materials within the volume, the breakdown of targeted radionuclides within the body, and so forth) to acquire data and to construct images or otherwise represent the observed internal features of the patient/object.

During MRI, when a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field B1) which is in the x-y plane and which is near the Larmor frequency, the net aligned moment, or "longitudinal magnetization", $M_z$, may be rotated, or "tipped", into the x-y plane to produce a net transverse magnetic moment, $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradient fields vary according to the particular localization method being used. The resulting set of received nuclear magnetic resonance (NMR) signals are digitized and processed to reconstruct the image using one of many well-known reconstruction techniques.

Typically, array coils (e.g., transmitting or receiving coils) utilize preamplifier decoupling to lower interaction between elements (e.g., coil loops or channels). Preamplifier decoupling produces a characteristic pair of high gain humps or horns above and below an operating frequency of the coil. As more decoupling is generated, the gain at the humps increases above that at the operating frequency. Due to the high gain, very slight feedback in the coils enables oscillations to occur at these frequencies. These parasitic oscillations occurs in the preamplifier when part of the output energy is coupled into the input. The oscillations may generate image artifacts and elevated noise.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a preamplifier arrangement for an MRI system is provided. The preamplifier arrangement includes a preamplifier coupled to a loop of a multi-channel coil array of the MRI system, wherein the preamplifier and the loop are subject to potentially form an unstable system with oscillation at one or more peak frequencies. The preamplifier arrangement also includes an impedance matching network disposed between and coupled to the preamplifier and the loop. The impedance matching network is configured to generate a high blocking impedance. The preamplifier arrangement further includes an input network disposed between and coupled to the preamplifier and the loop. The input network is configured to provide an input to suppress gain at the one or more peak frequencies.

In another embodiment, a radio frequency (RF) coil assembly for an MRI system is provided. The RF coil assembly includes an RF coil including a plurality of loops. The RF coil assembly also includes a plurality of preamplifiers, wherein each preamplifier of the plurality of preamplifiers is coupled to a different loop of the plurality of loops, and each preamplifier coupled to a respective loop is subject to potentially form an unstable system with oscillation at one or more peak frequencies. The RF coil assembly also includes an impedance matching network disposed between and coupled to each preamplifier and a respective loop each preamplifier is coupled to. The impedance matching network is configured to generate a high blocking impedance. The RF coil assembly further includes an input network disposed between and coupled to each preamplifier and the respective loop each preamplifier is coupled to. The input network is configured to provide an input to suppress gain at the one or more peak frequencies.

In a further embodiment, a method for suppressing oscillation in a multi-channel coil array of an MRI system is provided. The method includes receiving, at a plurality of preamplifiers of the MRI system, magnetic resonance signals from a corresponding plurality of channels of the multi-channel coil array, each preamplifier of the plurality of preamplifiers coupled to a different channel of the plurality of channels, and each preamplifier coupled to a respective channel is subject to potentially form an unstable system with oscillation at one or more peak frequencies. The method also includes generating a high blocking impedance via an impedance matching network disposed between and coupled to each preamplifier and corresponding channel. The method further includes providing an input to suppress gain at the one or more peak frequencies via an input network disposed between and coupled to each preamplifier and corresponding channel.

BRIEF DESCRIPTION OF THE DRAWINGS

These and other features, aspects, and advantages of the present subject matter will become better understood when the following detailed description is read with reference to the accompanying drawings in which like characters represent like parts throughout the drawings, wherein.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present subject matter, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

The disclosed embodiments provide an input network (e.g., stabilization input network) for providing an input (e.g., impedance) to suppress gain at frequencies of matched split peaks (e.g., decoupling horns) formed between preamplifiers coupled to corresponding loops (e.g., elements or channels) of a multi-channel coil array (e.g., receiving or transmitting coil array) of the MRI system, wherein each preamplifier and corresponding loop are subject to potentially form an unstable system with oscillation at one or more peak frequencies of the matched split peak frequencies. The matched split peaks are formed due to preamplifier blocking which is conducted via an impedance matching network. The input network is disposed between the preamplifiers and the corresponding loops of the multi-channel coil array. In certain embodiments, the input network is separate from the impedance matching network. For example, the input network is disposed between the loops and the impedance matching network. As another example, the input network is disposed between the impedance matching network and the preamplifiers. In certain embodiments, the input network is a distributed input network built-in to the impedance matching network. The input network enables increased impedance blocking to control (e.g., reduce) the high gain peaks of the matched split peaks. In particular, the input network reduces the gain of the coil elements. By lowering the feedback and the risk of oscillation, even higher levels of preamplifier decoupling may be used to benefit highly adaptable coils.

Figure 1:
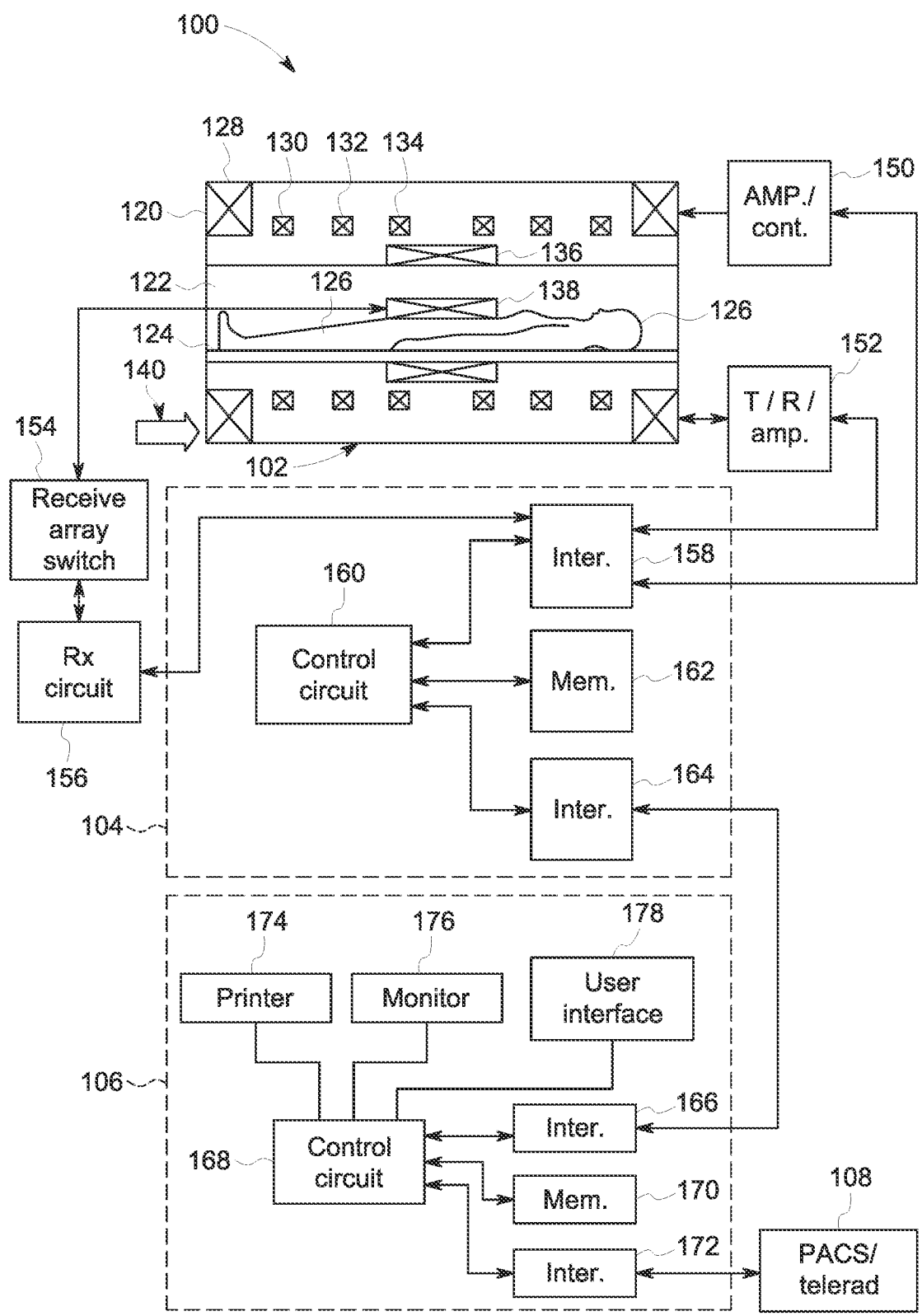
FIG. 1 illustrates an embodiment of a magnetic resonance imaging (MRI) system suitable for use with the disclosed technique.

With the preceding in mind, FIG. 1 a magnetic resonance imaging (MRI) system 100 is illustrated schematically as including a scanner 102, scanner control circuitry 104, and system control circuitry 106. According to the embodiments described herein, the MRI system 100 is generally configured to perform MR imaging.

System 100 additionally includes remote access and storage systems or devices such as picture archiving and communication systems (PACS) 108, or other devices such as teleradiology equipment so that data acquired by the system 100 may be accessed on- or off-site. In this way, MR data may be acquired, followed by on- or off-site processing and evaluation. While the MRI system 100 may include any suitable scanner or detector, in the illustrated embodiment, the system 100 includes a full body scanner 102 having a housing 120 through which a bore 122 is formed. A table 124 is moveable into the bore 122 to permit a patient 126 to be positioned therein for imaging selected anatomy within the patient.

Scanner 102 includes a series of associated coils for producing controlled magnetic fields for exciting the gyromagnetic material within the anatomy of the subject being imaged. Specifically, a primary magnet coil 128 is provided for generating a primary magnetic field, B0, which is generally aligned with the bore 122. A series of gradient coils 130, 132, and 134 permit controlled magnetic gradient fields to be generated for positional encoding of certain of the gyromagnetic nuclei within the patient 126 during examination sequences. A radio frequency (RF) coil 136 (e.g., RF transmit coil) is configured to generate radio frequency pulses for exciting the certain gyromagnetic nuclei within the patient. In addition to the coils that may be local to the scanner 102, the system 100 also includes a set of receiving coils or RF receiving coils 138 (e.g., an array of coils) configured for placement proximal (e.g., against) to the patient 126. As an example, the receiving coils 138 can include cervical/thoracic/lumbar (CTL) coils, head coils, single-sided spine coils, and so forth. In certain embodiments, the RF receiving coils 138 may be part of a multi-stage coil disposed about an extremity (e.g., arm or leg) of the patient 126 as described below. Generally, the receiving coils 138 are placed close to or on top of the patient 126 so as to receive the weak RF signals (weak relative to the transmitted pulses generated by the scanner coils) that are generated by certain of the gyromagnetic nuclei within the patient 126 as they return to their relaxed state.

The various coils of system 100 are controlled by external circuitry to generate the desired field and pulses, and to read emissions from the gyromagnetic material in a controlled manner. In the illustrated embodiment, a main power supply 140 provides power to the primary field coil 128 to generate the primary magnetic field, $B_0$. A power input 44 (e.g., power from a utility or grid), a power distribution unit (PDU), a power supply (PS), and a driver circuit 150 may together provide power to pulse the gradient field coils 130, 132, and 134. The driver circuit 150 may include amplification and control circuitry for supplying current to the coils as defined by digitized pulse sequences output by the scanner control circuit 104.

Another control circuit 152 is provided for regulating operation of the RF coil 136. Circuit 152 includes a switching device for alternating between the active and inactive modes of operation, wherein the RF coil 136 transmits and does not transmit signals, respectively. Circuit 152 also includes amplification circuitry configured to generate the RF pulses. Similarly, the receiving coils 138 are connected to switch 154, which is capable of switching the receiving coils 138 between receiving and non-receiving modes. Thus, the receiving coils 138 resonate with the RF signals produced by relaxing gyromagnetic nuclei from within the patient 126 while in the receiving mode, and they do not resonate with RF energy from the transmitting coils (i.e., coil 136) so as to prevent undesirable operation while in the non-receiving mode. Additionally, a receiving circuit 156 is configured to receive the data detected by the receiving coils 138 and may include one or more multiplexing and/or amplification circuits.

It should be noted that while the scanner 102 and the control/amplification circuitry described above are illustrated as being coupled by a single line, many such lines may be present in an actual instantiation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner and either or both of the scanner and system control circuitry 104, 106.

As illustrated, scanner control circuit 104 includes an interface circuit 158, which outputs signals for driving the gradient field coils and the RF coil and for receiving the data representative of the magnetic resonance signals produced in examination sequences. The interface circuit 158 is coupled to a control and analysis circuit 160. The control and analysis circuit 160 executes the commands for driving the circuit 150 and circuit 152 based on defined protocols selected via system control circuit 106.

Control and analysis circuit 160 also serves to receive the magnetic resonance signals and performs subsequent processing before transmitting the data to system control circuit 106. Scanner control circuit 104 also includes one or more memory circuits 162, which store configuration parameters, pulse sequence descriptions, examination results, and so forth, during operation.

Interface circuit 164 is coupled to the control and analysis circuit 160 for exchanging data between scanner control circuit 104 and system control circuit 106. In certain embodiments, the control and analysis circuit 160, while illustrated as a single unit, may include one or more hardware devices. The system control circuit 106 includes an interface circuit 166, which receives data from the scanner control circuit 104 and transmits data and commands back to the scanner control circuit 104. The control and analysis circuit 168 may include a CPU in a multi-purpose or application specific computer or workstation. Control and analysis circuit 168 is coupled to a memory circuit 170 to store programming code for operation of the MRI system 100 and to store the processed image data for later reconstruction, display and transmission. The programming code may execute one or more algorithms that, when executed by a processor, are configured to perform reconstruction of acquired data as described below. In certain embodiments, the memory circuit 170 may store one or more neural networks for reconstruction of acquired data as described below. In certain embodiments, image reconstruction may occur on a separate computing device having processing circuitry and memory circuitry.

An additional interface circuit 172 may be provided for exchanging image data, configuration parameters, and so forth with external system components such as remote access and storage devices 108. Finally, the system control and analysis circuit 168 may be communicatively coupled to various peripheral devices for facilitating operator interface and for producing hard copies of the reconstructed images. In the illustrated embodiment, these peripherals include a printer 174, a monitor 176, and user interface 178 including devices such as a keyboard, a mouse, a touchscreen (e.g., integrated with the monitor 176), and so forth.

Figure 2:
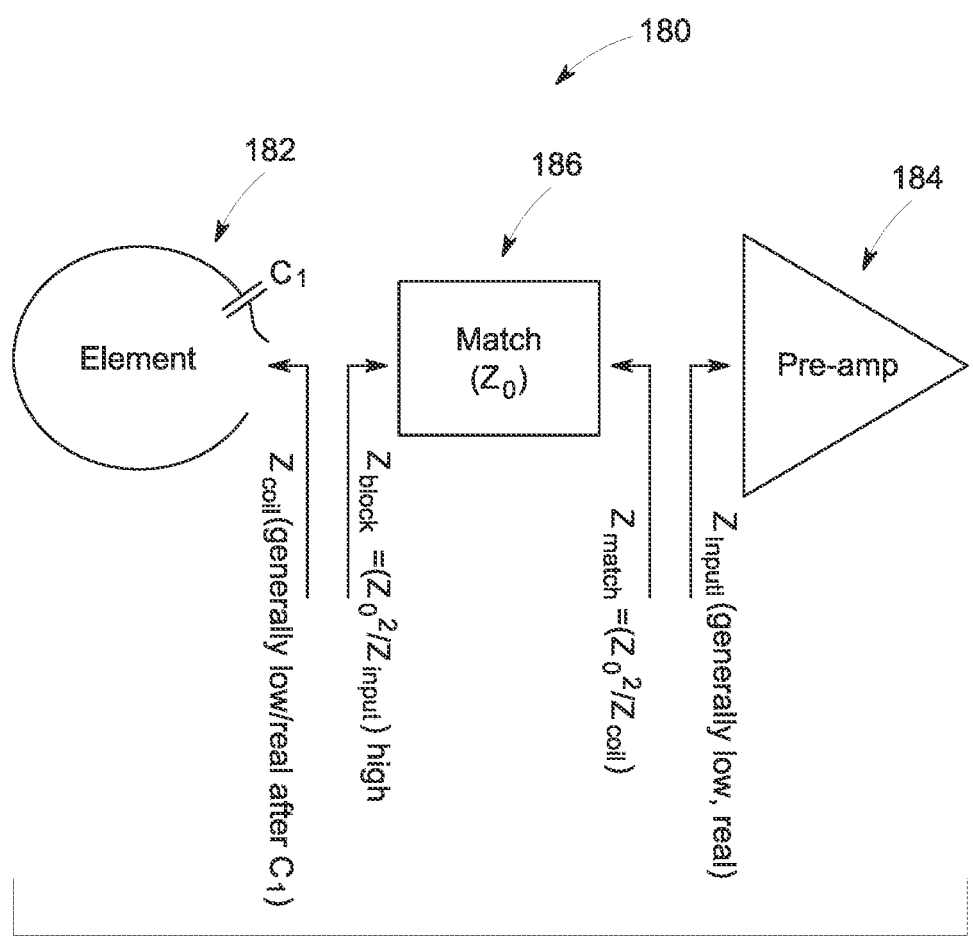
FIG. 2 illustrates a preamplifier arrangement for preamplifier decoupling.

FIG. 2 illustrates a preamplifier arrangement 180 for preamplifier decoupling. As depicted, the preamplifier arrangement 180 includes an element 182 (e.g., loop or channel) of a multi-channel coil array (e.g., surface RF coil array such as an RF transmitting coil, RF receiving coil, or RF transmitting/receiving coil) and a corresponding preamplifier 184 (e.g., on-coil preamplifier) coupled to the element 182. The multi-channel coil array includes a plurality of elements 182 and a plurality of preamplifiers 184. Each element 182 is coupled to a different corresponding preamplifier 184. As depicted, an impedance matching network 186 is disposed between and coupled to the element 182 and the preamplifier 184. The impedance matching network 186 may be coupled to each pair (or at least multiple pairs) of elements 182 and preamplifiers 184 of the multi-channel coil array.

Each preamplifier 184 may be a low input impedance ($Z_{input}$) preamplifier configured to receive a relatively high blocking ($Z_{block}$) or source impedance (e.g., due to the impedance matching network 186). The preamplifiers 184 isolate the elements 182 from each other. During the transmission of the RF magnetic field pulses, the receive RF coils are decoupled or disabled and during reception the transmit RF coils are decoupled or disabled. When the elements 182 are part of a receiving coil, the elements 182 detect or sense MR signals from excited nuclei in a patient. The preamplifier 184 receives the MR signal from the corresponding element 182 and amplifies the received MR signal. The impedance matching network 186 is configured to transform a coil impedance ($Z_{coil}$) into an optimal source impedance ($Z_{match}$) for the preamplifier 184.

Figure 3:
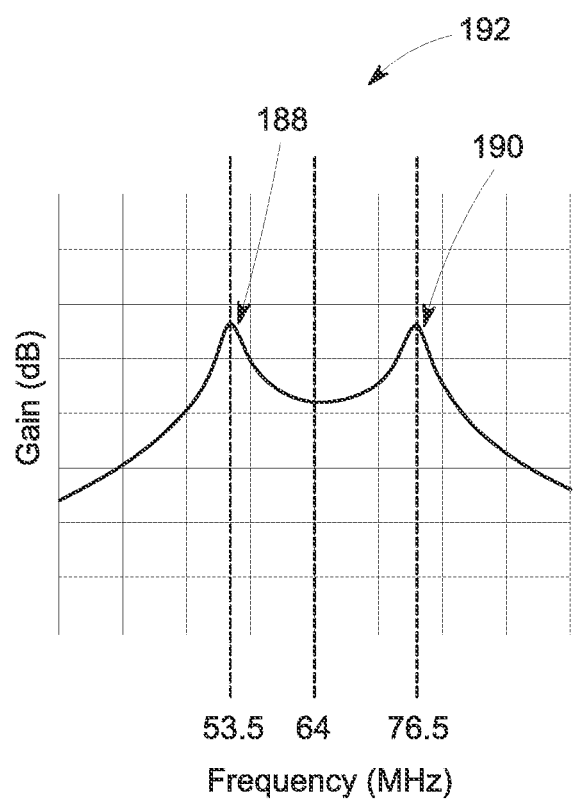
FIG. 3 illustrates a graph for frequency response when an impedance matching network is utilized (e.g., without an input network)
Figure 4:
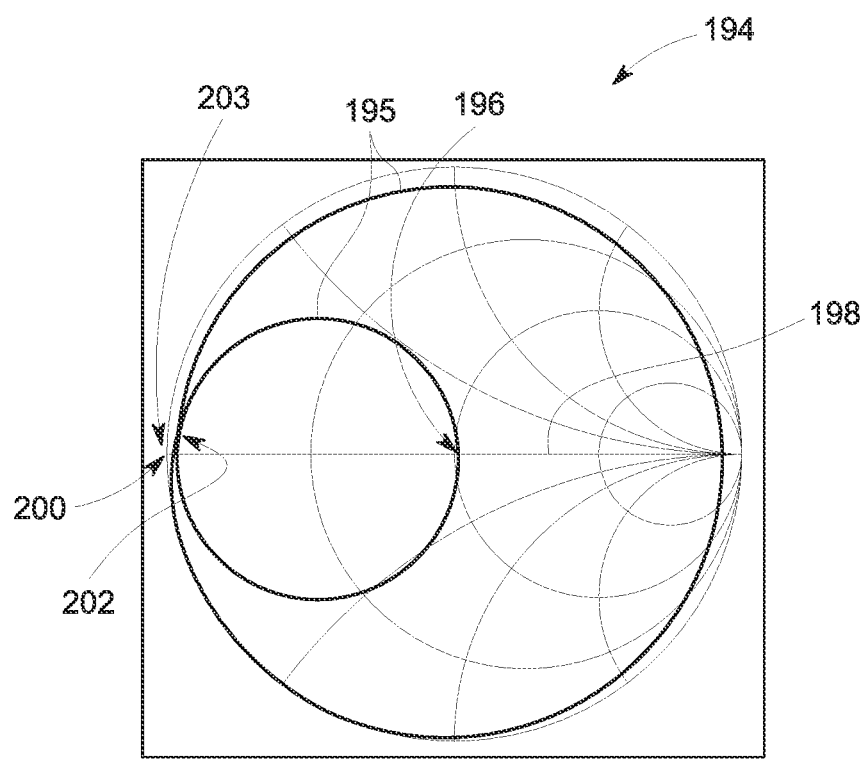
FIG. 4 illustrates a Smith chart for output reflection coefficient to illustrate impedance matching when an impedance matching network is utilized (e.g., without an input network)

Each element 182, preamplifier 184, and corresponding interfaces form an unstable system with the potential for oscillation. Increased loop gain of these systems at matched split peak frequencies 188, 190 (e.g., decoupling horns or high gain humps), as shown in graph 192 of FIG. 3, is often high enough to promote oscillation at these frequencies. The peaks 188, 190 are a result of matching for high $Z_{block}$ and optimum $Z_{match}$ at the coil operating frequency. The system gain is very high at the horn frequencies, increasing as blocking is raised. As depicted in graph 190, assuming an operating frequency of the coil is 64 megahertz (MHz), the peaks 188, 190 are above and below the operating frequency at approximately 53.5 and 76.5 MHz, respectively. The frequency of the peaks 188, 190 may vary based on the operating frequency of the coil. The Smith chart 194 in FIG. 4 illustrates the impact of blocking impedance (e.g., indicated by the output reflection coefficient 195) from the impedance matching network 186. As depicted in the Smith chart 194, the preamplifier 184 receives approximately 50 ohms (e.g., optimum source impedance for noise) at 64 MHz at impedance location 196 along line 198 (e.g., Smith line). However, the preamplifier 184 has very low optimum gain impedances at 53.5 and 76.5 MHz at impedance locations 200 and 202 (which are near a region 203 of maximum gain for the preamplifier 184) along the line 198 (e.g., Smith line) of the Smith chart 192. As described herein, the disclosed embodiments include an input network between each element 182 and corresponding preamplifier 184 to reduce or minimize high humps or horns. Being able to control these high gain peaks may enable increased blocking (i.e., higher levels of preamplifier decoupling) without the risk of oscillation.

Figure 5:
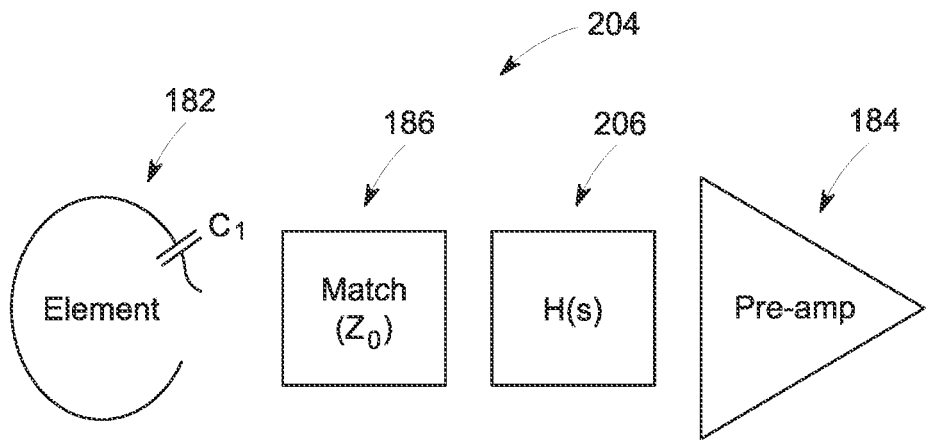
FIG. 5 illustrates a preamplifier arrangement for preamplifier decoupling having an input network (e.g., located between an impedance matching network and a preamplifier), in accordance aspects of the present disclosure.
Figure 6:
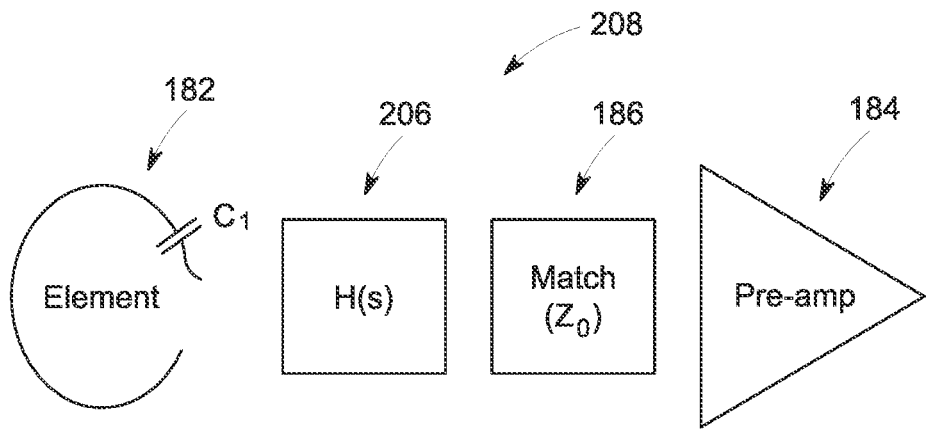
FIG. 6 illustrates a preamplifier arrangement for preamplifier decoupling having an input network (e.g., located between a coil element and an impedance matching network), in accordance aspects of the present disclosure.
Figure 7:
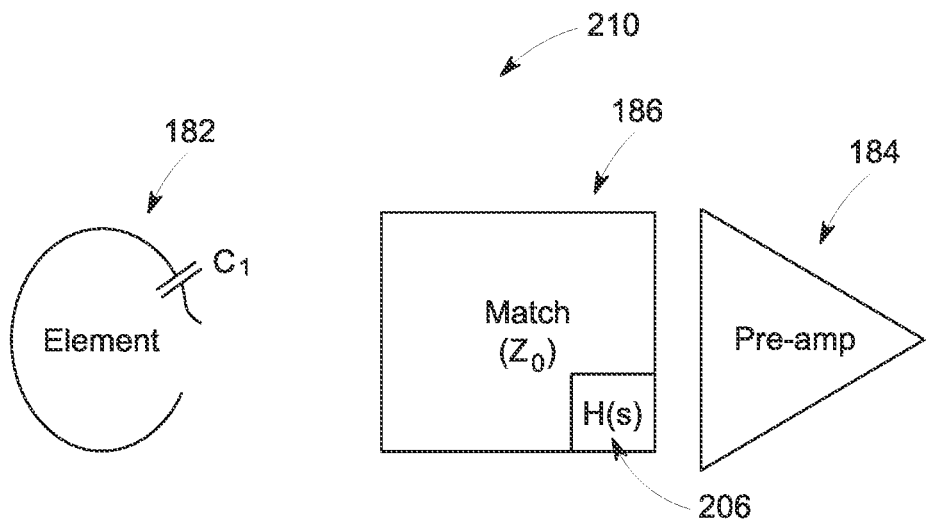
FIG. 7 illustrates a preamplifier arrangement for preamplifier decoupling having an input network (e.g., located within an impedance matching network), in accordance aspects of the present disclosure.

FIGS. 5-7 illustrate preamplifier arrangements 204, 208, 210 for preamplifier decoupling having an input network 206. With the exception of the input network 206, the preamplifier arrangements 204, 208, 210 are similar to the preamplifier arrangement 180 in FIG. 2. The input network 206 is configured to provide an input (e.g., impedance) at the match split peaks to suppress gain at the frequencies of the matched split peaks. The input network 206 is a transfer function of the system (i.e., the preamplifier arrangement 204, 208, or 210) in the S domain (e.g., frequency domain). The input network 206 is located upstream of the preamplifier 184 and modifies the impedance input into the preamplifier 184. Similar to the impedance matching network 186, the input network 206 may be coupled to each pair (or at least multiple pairs) of elements 182 and preamplifiers 184 of the multi-channel coil array.

The input network 206 may be separate from or part of the impedance matching network 186. As depicted in the preamplifier arrangement 204 in FIG. 5, the input network 206 is located between and coupled to the impedance matching network 186 and the preamplifier 184 (e.g., on the low impedance side of the impedance matching network 186). As depicted in the preamplifier arrangement 208 in FIG. 6, the input network 206 is located between and coupled to the element 182 and the impedance matching network 186 (e.g., on the high impedance side of the impedance matching network 186). As depicted in the preamplifier arrangement 210 in FIG. 7, the input network 206 is a distributed input network built-in to the impedance matching network 186.

Figure 8:
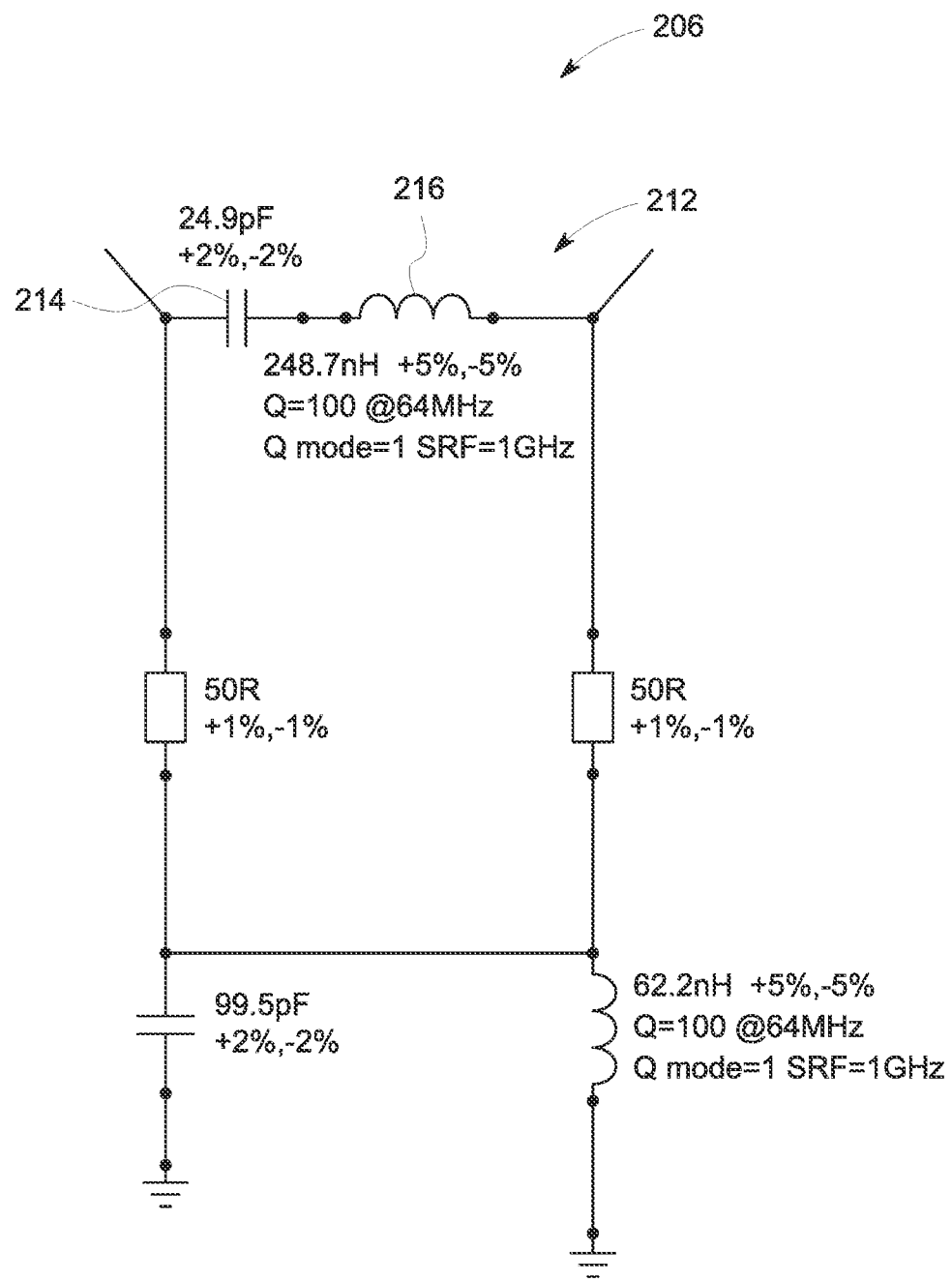
FIG. 8 illustrates an example of a bandpass (BP) diplexer as an input network, in accordance with aspects of the present disclosure.

In certain embodiments, the input network 206 may be a BP diplexer 212 as depicted in FIG. 8. The BP diplexer 212 may be separate from the impedance matching network. The BP diplexer 212 presents a broadband termination to the component of the preamplifier arrangement that is located to the left of the BP diplexer 212. For example, if the BP diplexer 212 is located on the high impedance side between the coil element and the impedance matching network, the BP diplexer presents a broadband termination for the coil element. If the BP diplexer 212 is located on the low impedance side between the impedance matching network and the preamplifier, the BP diplexer 2212 presents a broadband termination for the impedance matching network. As depicted, the BP diplexer 212 includes a series resonance circuit of a capacitor 214 and an inductor 216. Due to this series resonance circuit, only a small bandwidth can pass to the next stage if it has frequency within the frequency range. For example, the next stage is the impedance matching network when the BP diplexer 212 is located on the high impedance side between the coil element and the impedance matching network. The next stage is the preamplifier when the BP diplexer 212 is located on the low impedance side between the impedance matching network and the preamplifier. All other frequencies, above and below, the small bandwidth flow to resistors 218 and 220 (e.g., 50 ohm resistors) of the BP diplexer 212. In certain embodiments, the lossy components of the network 206 may not be discrete resistors, but instead could be related to the finite Q of the components used in a particular stabilizing network.

Figure 9:
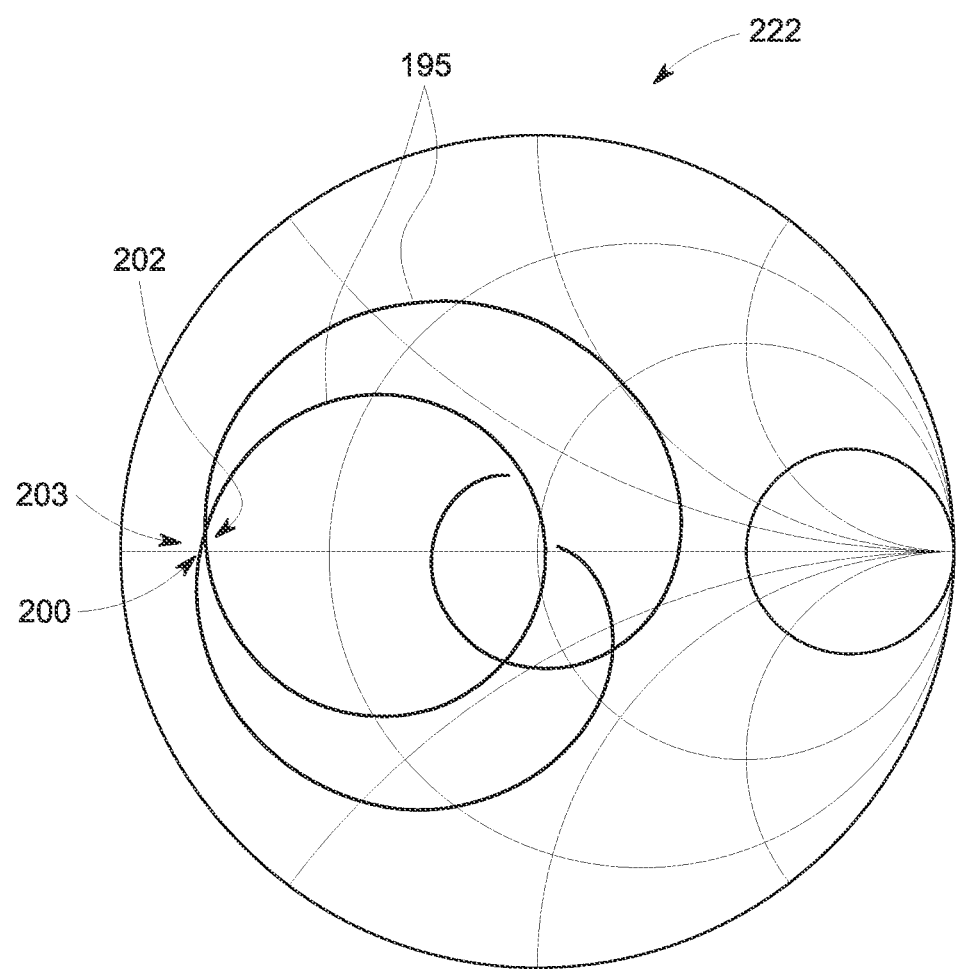
FIG. 9 illustrates a Smith chart for impedance matching when an impedance network and an input network (e.g., BP diplexer) are both utilized, in accordance with aspects of the present disclosure.
Figure 10:
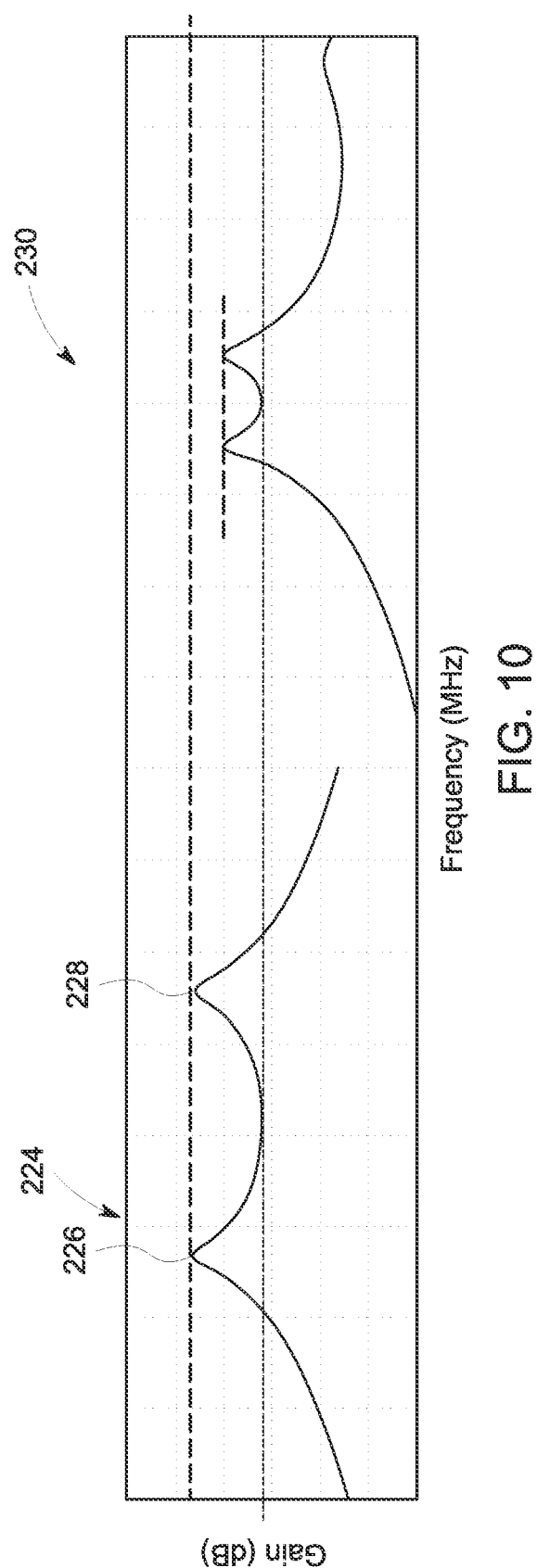
FIG. 10 illustrates a graph for frequency response when an impedance matching network and an input network are both utilized (e.g., BP diplexer), in accordance with aspects of the present disclosure.

Assuming a BP diplexer (e.g., BP diplexer 212 in FIG. 7) is located between the impedance matching network and the preamplifier, the low impedance locations 200, 202 seen in FIG. 8 are pushed closer together as depicted in the Smith chart 222 in FIG. 9 and further away from region 203 of maximum gain of the preamplifier. FIG. 10, on the left side, depicts a graph 224 (similar to graph 192 in FIG. 3) for a preamplifier arrangement lacking an input network having gain peaks 226, 228. FIG. 10, on the right side, depicts a graph 230 for a preamplifier arrangement having the BP diplexer located between the impedance matching network and the preamplifier. As depicted in graph 230, input (e.g., impedance) from the BP diplexer reduces the gain of both of the peaks 226, 228 (e.g., by approximately 8 dB) and the peaks 226, 228 are shifted in toward each other. As depicted in graph 230, the input from the BP diplexer had minimal impact on the gain at the optimal frequency (at the location between the peaks 226, 228). As mentioned above, in certain embodiments, the BP diplexer may be located between the coil element and the impedance matching network to similarly reduce the gain of the peaks 226, 228.

Figure 11:
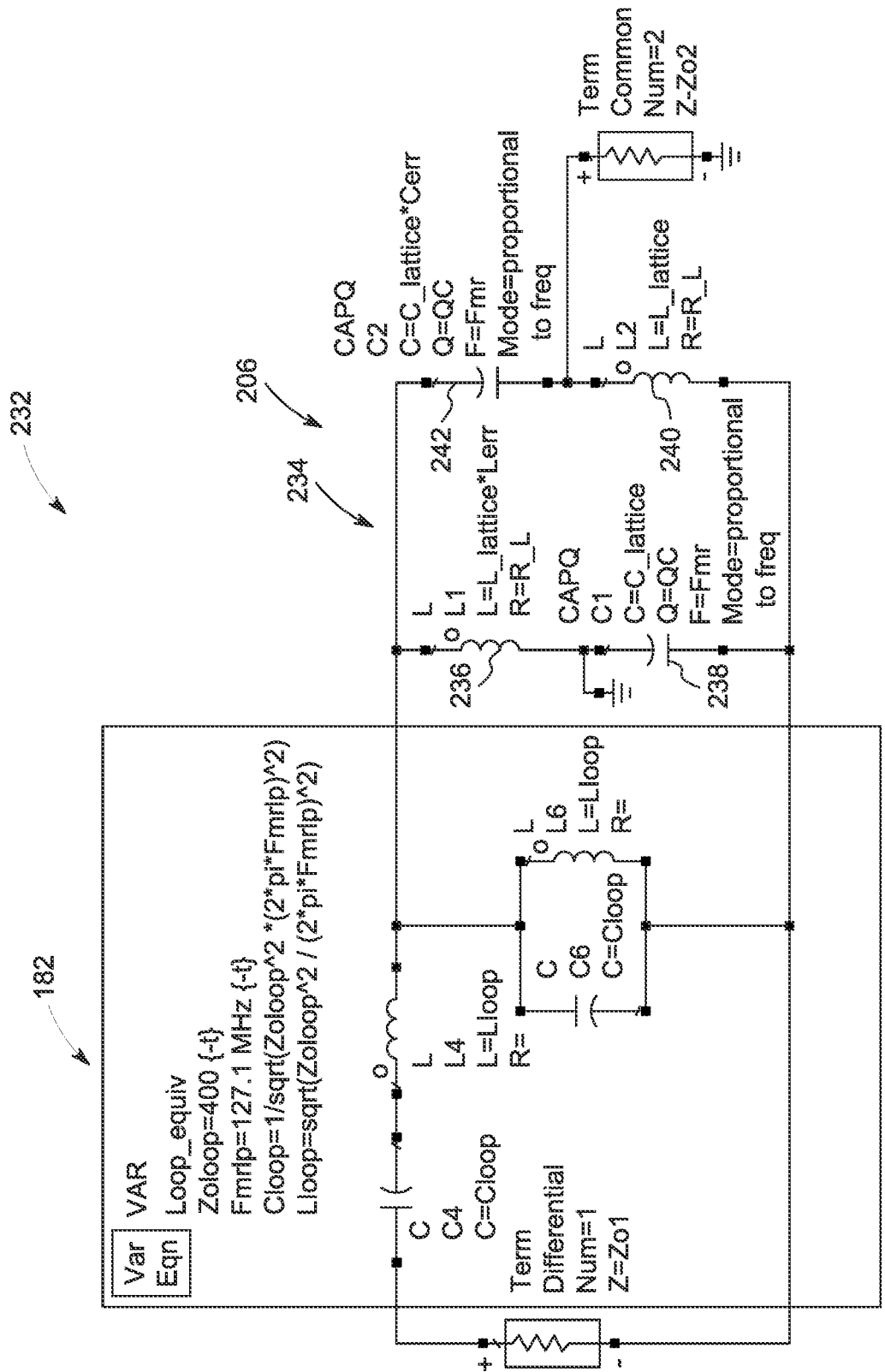
FIG. 11 illustrates a portion of a preamplifier arrangement (e.g., having a coil element and an input network (e.g., series inductor-capacitor network)), in accordance with aspects of the present disclosure.

FIG. 11 illustrates a portion of a preamplifier arrangement 232 having a different input network 206. The preamplifier arrangement 232 includes the coil element 182 coupled to the input network 206. The input network 206 includes a series inductor-capacitor network 234. The output of the input network 206 is provided to the impedance matching network and subsequently to the preamplifier which are not shown in FIG. 11. The series inductor-capacitor network 234 includes an inductor 236 (L1) in series with a capacitor 238 (C1). The series inductor-capacitor network 234 also includes an inductor 240 (L2) in series with a capacitor 242 (C2).

Figure 12:
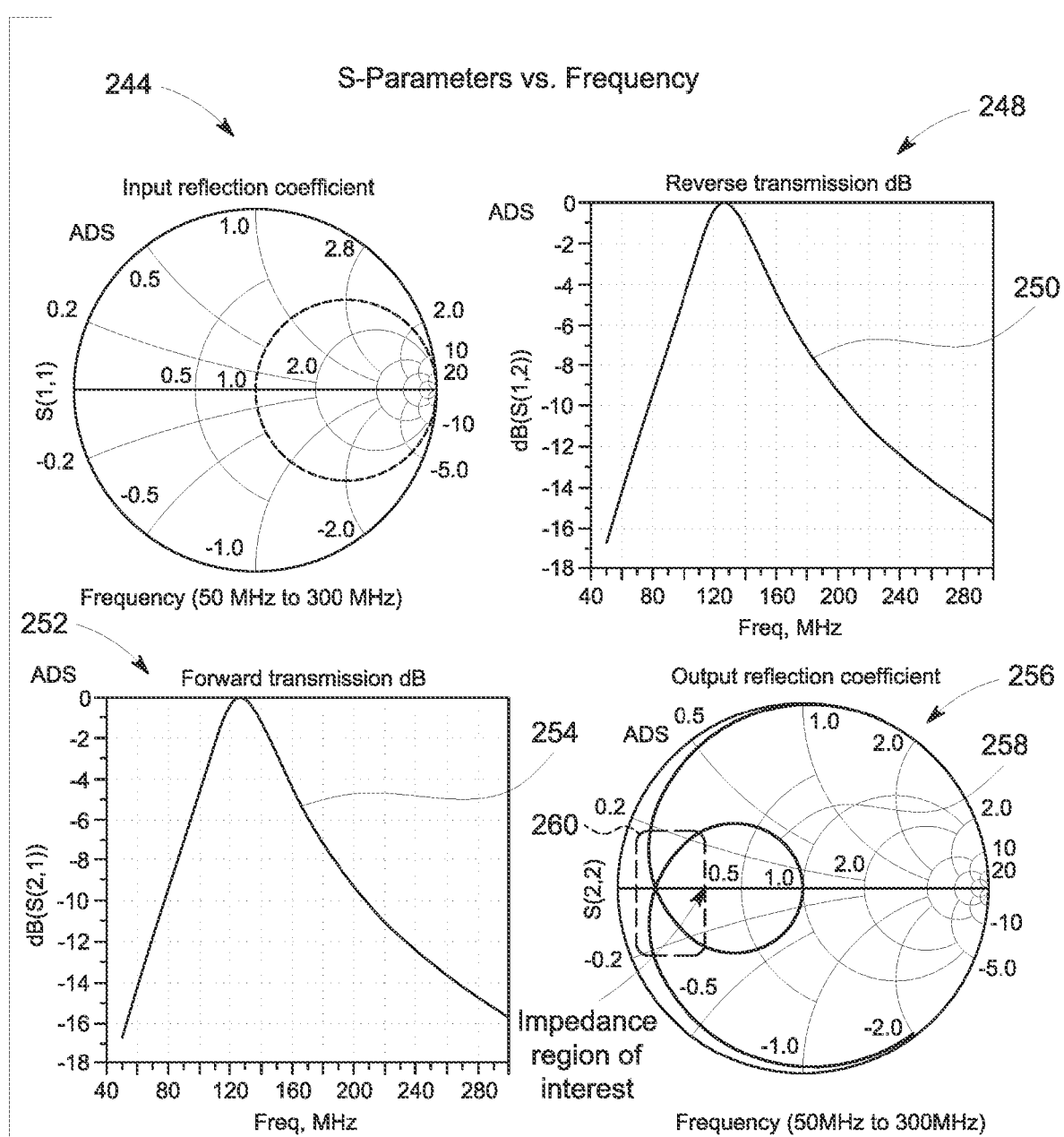
FIG. 12 illustrates different S-parameters versus frequency for the preamplifier arrangement in FIG. 11, in accordance with aspects of the present disclosure.
Figure 13:
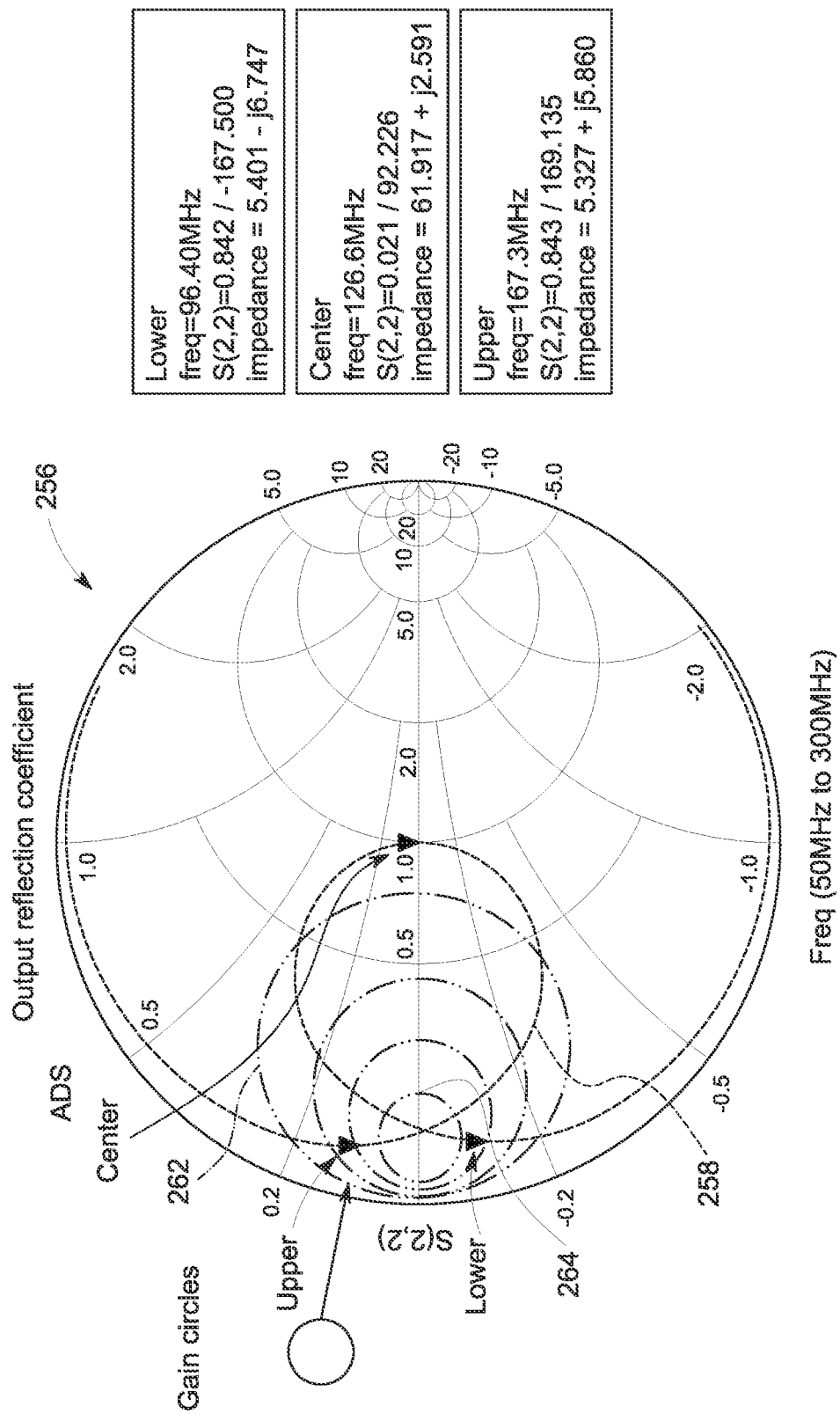
FIG. 13 illustrates gain circles or stability circles in the impedance region of interest due to a series inductor-capacitor network of FIG. 11 in a Smith chart of output reflection coefficient in FIG. 12, in accordance with aspects of the present disclosure.
Figure 14:
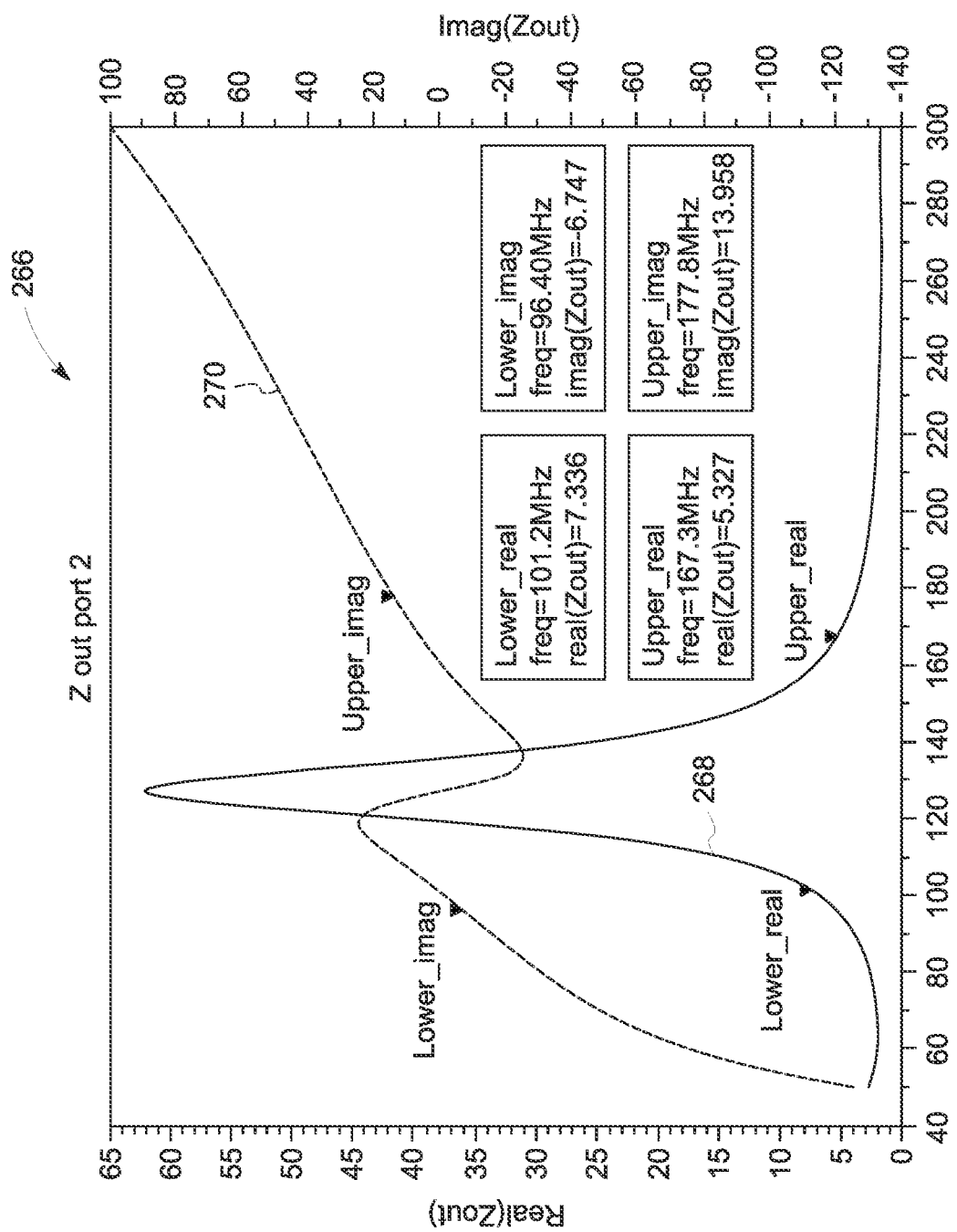
FIG. 14 illustrates a frequency curve of real and imaginary impedances for the preamplifier arrangement in FIG. 11, in accordance with aspects of the present disclosure.

FIGS. 12-14 illustrate the performance of the series inductor-capacitor network 234 in FIG. 11. FIG. 12 illustrates the S-parameters versus frequency. The Smith chart 244 in FIG. 12 illustrates the input reflection coefficient 246. The graph 248 in FIG. 12 illustrates the reverse transmission signal 250. The graph 252 in FIG. 12 illustrates the forward transmission signal 254. The Smith chart 258 in FIG. 12 illustrates the output reflection coefficient 258. The dashed box 260 in the Smith chart 258 represents the impedance region of interest. FIG. 13 illustrates gain circles or stability circles 262 in the impedance region of interest 260 in the Smith chart 258 of FIG. 12 due to the series inductor-capacitor network 234 in FIG. 11. The upper arrow, the lower arrow, and the center arrow represent the locations along the output reflection coefficient 258 corresponding to the lower frequency (relative to the center frequency), upper frequency (relative to the center frequency), and center frequency (e.g., operating frequency), respectively. The lower and upper frequencies are the frequencies of the gain humps or peaks. The smallest gain circle 264 represents the maximum gain. The location of the lower frequency, the upper frequency, and the center frequency of the output reflection coefficient 258 are located outside the gain circle 264 with the maximum gain. The impedances at the upper frequency and the lower frequency are low relative to the impedance at the center frequency.

FIG. 14 illustrates a frequency curve 266 of real and imaginary impedances for the preamplifier arrangement in FIG. 11. Plots 268 and 270 represent the real and imaginary impedances, respectively, relative to frequency. The series inductor-capacitor network 234 in FIG. 11 results in the real impedance 268 being lower relative to the imaginary impedances 270 at the lower and upper frequencies.

Figure 15:
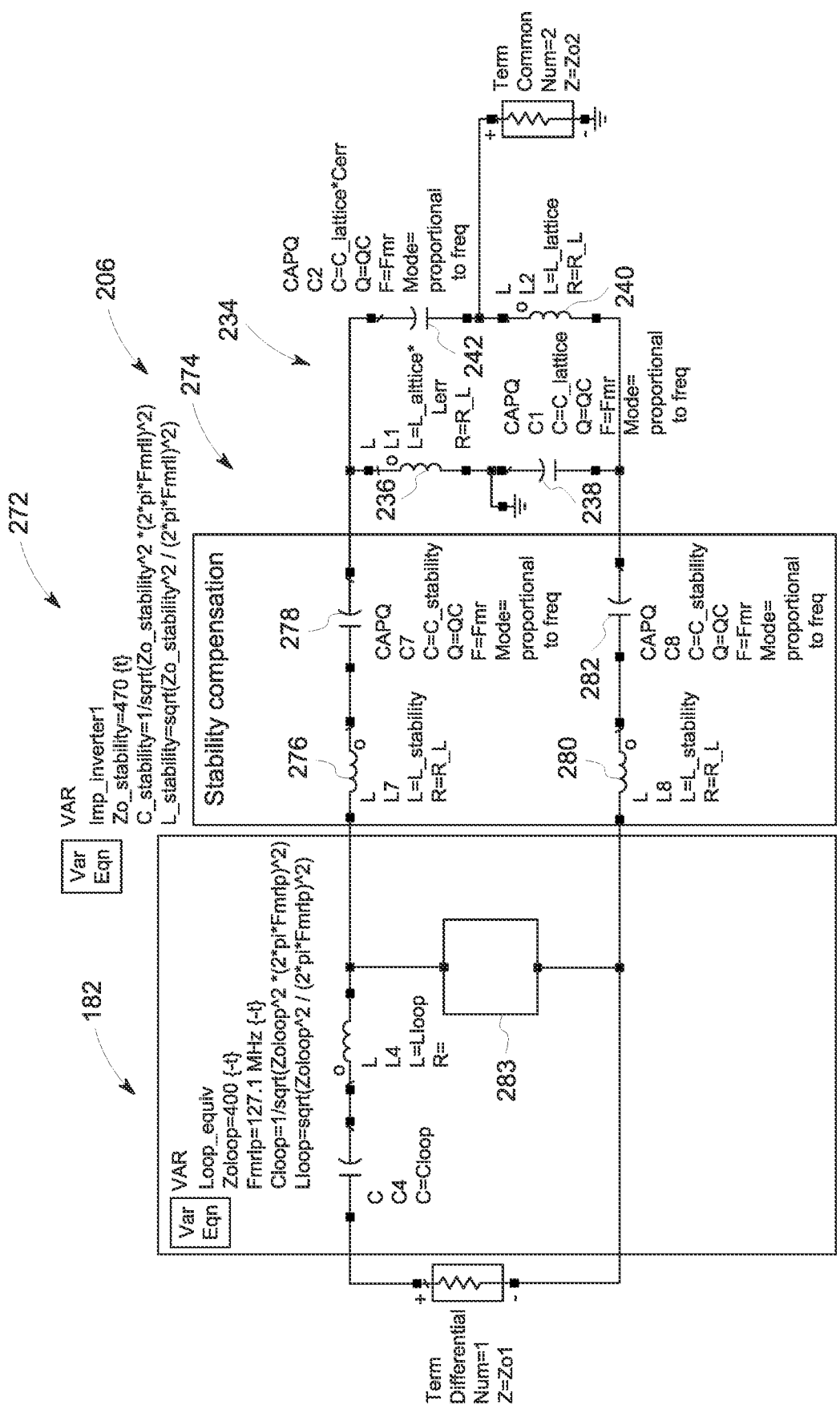
FIG. 15 illustrates a portion of a preamplifier arrangement (e.g., having a coil element and an input network (e.g., series inductor-capacitor network and stability compensation circuit)), in accordance with aspects of the present disclosure.

FIG. 15 illustrates a portion of a preamplifier arrangement 272 having another different input network 206. The preamplifier arrangement 272 includes the coil element 182 coupled to the input network 206. Similar to the preamplifier arrangement 232 in FIG. 11, the input network 206 includes the series inductor-capacitor network 234 as described in FIG. 11. In addition, the input network 206 includes a stability compensation circuit 274 disposed between the coil element 182 and the series inductor-capacitor network 234. The stability compensation circuit 274 is also a series inductor-capacitor network. The stability compensation circuit 274 includes an inductor 276 (L7) in series with a capacitor 278 (C7). The stability compensation circuit 274 also includes an inductor 280 (L8) in series with a capacitor 282 (C8). The output of the input network 206 is provided to the impedance matching network and subsequently to the preamplifier which are not shown in FIG. 15. The coil element 182 includes a resonator 283 (e.g., represented by a square in FIG. 15). In certain embodiments, the resonator 283 includes a parallel resonator. In certain embodiments, the resonator 283 includes a pair of parallel resonators that bandpasses at the operating frequency but parks lossy notches near the horn frequencies.

Figure 16:
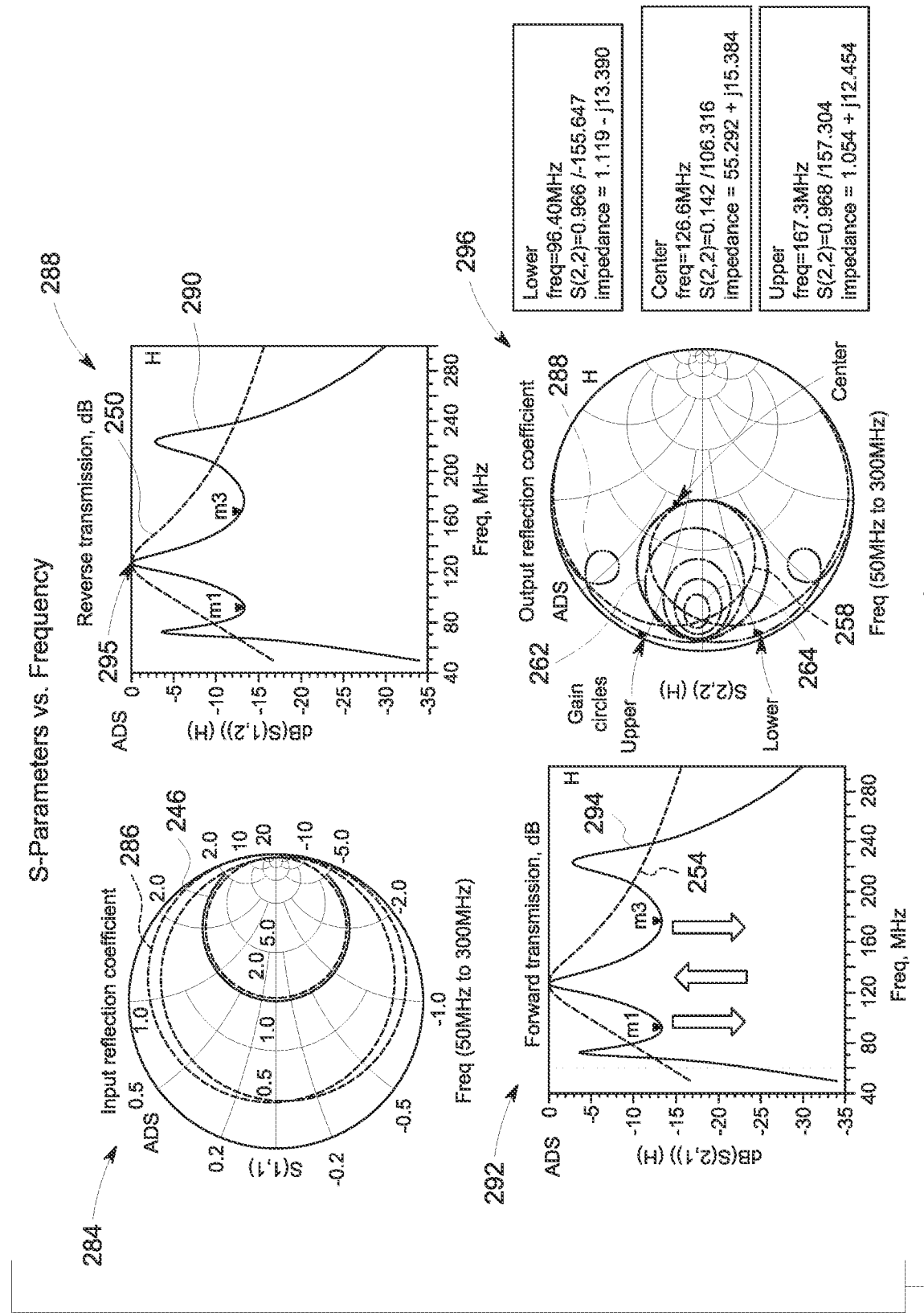
FIG. 16 illustrates different S-parameters versus frequency for the preamplifier arrangement in FIG. 15, in accordance with aspects of the present disclosure.
Figure 17:
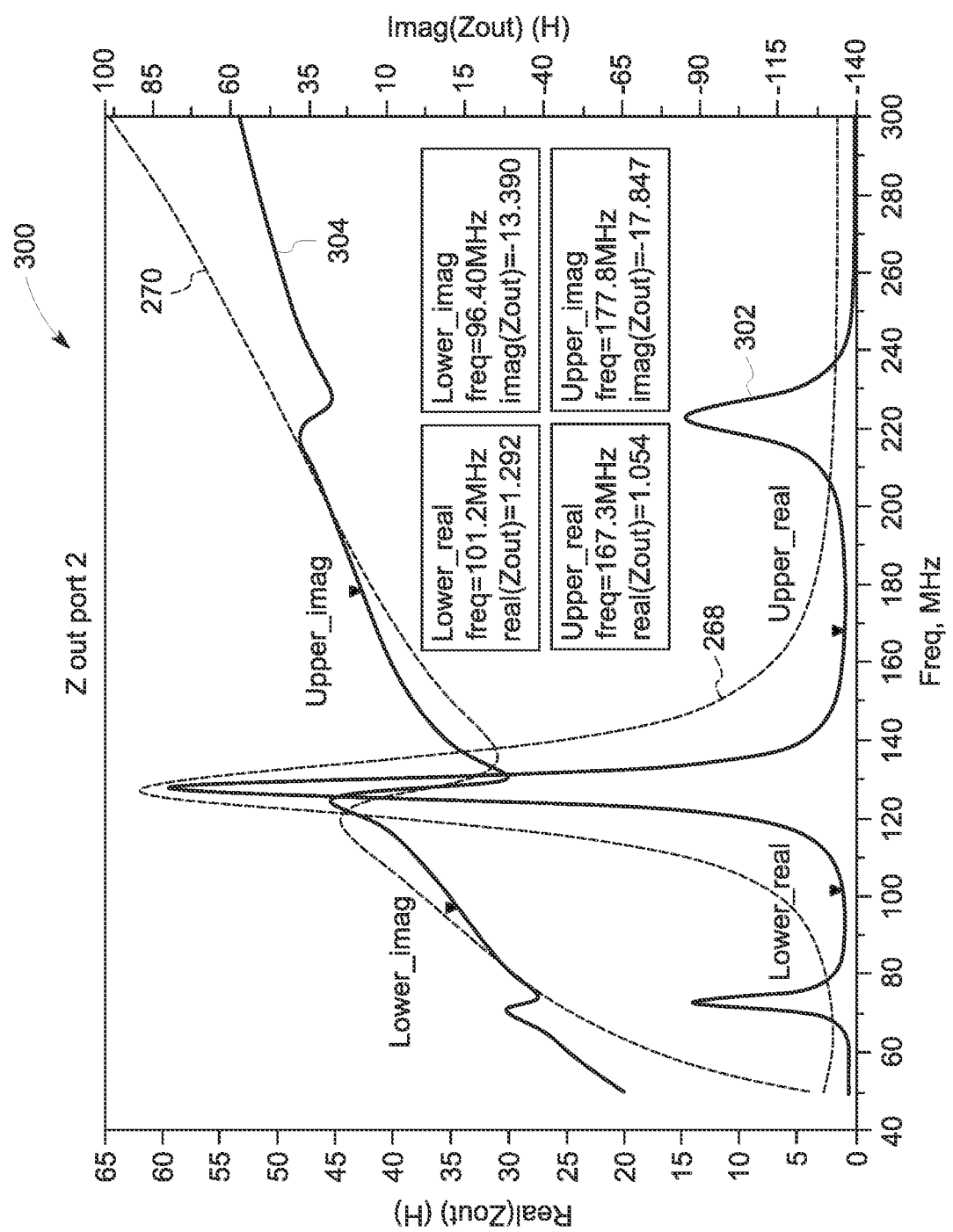
FIG. 17 illustrates a frequency curve of real and imaginary impedances for the preamplifier arrangement in FIG. 15, in accordance with aspects of the present disclosure.

FIGS. 16 and 17 illustrate the performance of the input network 206 in FIG. 15. FIG. 16 illustrates the S-parameters versus frequency. The Smith chart 284 in FIG. 16 illustrates the input reflection coefficient 286 due to the input network 206 in FIG. 15 relative to the input reflection coefficient 246 due to the input network 206 in FIG. 11. The graph 288 in FIG. 16 illustrates the reverse transmission signal 290 due to the input network 206 in FIG. 15 relative to the reverse transmission signal 250 due to the input network 206 in FIG. 11. The graph 292 in FIG. 16 illustrates the forward transmission signal 294 due to the input network 206 in FIG. 15 compared to the forward transmission signal 254 due to the input network 206 in FIG. 11. Both the reverse transmission signal 290 and the forward transmission signal 294 are reduced (e.g., by approximately 6 to 7 dB) at the lower and higher frequencies (indicated by m1 and m3) relative to the reverse transmission signal 250 and the forward transmission signal 254, respectively, while the gain of the center (e.g., at the operating frequency) indicated by arrow 295 is preserved or maintained. The Smith chart 296 in FIG. 16 illustrates the output reflection coefficient 298 due to the input network 206 in FIG. 15 relative to the output reflection coefficient 258 due to the input network 206 in FIG. 11. As indicated by the Smith chart 296, the output impedance of the input network 206 in FIG. 15 is preserved or maintained relative to the output impedance of the input network in FIG. 11. The location of the lower frequency, the upper frequency, and the center frequency of the output reflection coefficient 298 are located outside the gain circle 264 with the maximum gain. The impedances at the upper frequency and the lower frequency are low relative to the impedance at the center frequency.

FIG. 17 illustrates a frequency curve 300 of real and imaginary impedances for the preamplifier arrangement in FIG. 15 relative to the real and imaginary impedance for the preamplifier arrangement in FIG. 11. Plots 268 and 270 represent the real and imaginary impedances, respectively, relative to frequency for the preamplifier arrangement in FIG. 11. Plots 302 and 304 represent the real and imaginary impedances, respectively, relative to frequency for the preamplifier arrangement in FIG. 15. The input network 206 in FIG. 15 results in the real impedance 302 being lower relative to the imaginary impedances 304 at the lower and upper frequencies. In addition, the real impedances 302 at the lower and upper frequencies are lower for the input network 206 in FIG. 15 relative to the real impedances 268 for the input network 206 in FIG. 11.

Figure 18:
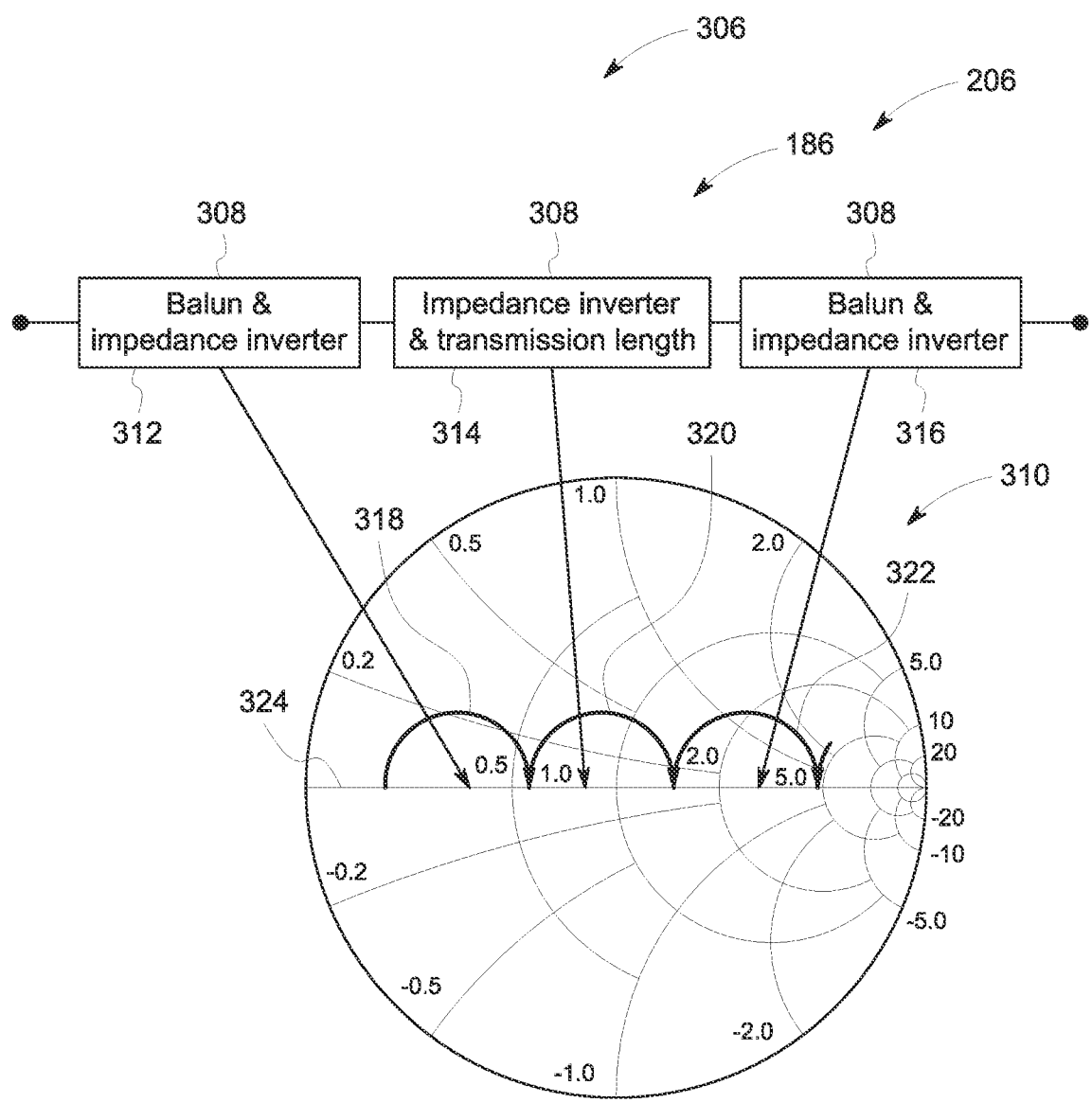
FIG. 18 illustrates a portion of a preamplifier arrangement having a series of impedance inverters and a Smith chart illustrating impedance arcs for the series of impedance inverters, in accordance with aspects of the present disclosure.

As mentioned above, the input network may be integrated within the impedance matching network. FIG. 18 illustrates a portion of a preamplifier arrangement 306 having a series or cascade of impedance inverters 308 coupled together and a Smith chart 310 illustrating impedance arcs for the series of impedance inverters 308. The impedance inverters 308 form a distributed input network 206 built-in to the impedance matching network 186. The impedance matching network 186 and the distributed input network 206 are disposed between the coil element and the preamplifier which are not shown in FIG. 18. The series of impedance inverters 308 include three impedance inverters 312, 314, and 316. The impedance inverters 312 and 314 are each a balun (e.g., common-mode trap). Typically, common-mode currents are blocked by using baluns. Baluns or common-mode traps provide high common-mode impedances, which in turn reduces the effect of transmitter-driven currents. Each balun may be a lattice balun or lumped LC balun having two inductors and two capacitors. The impedance inverter 314 includes a couple of transmission lines that couple the baluns to each other. In the Smith chart 310, the respective impedance arcs 318, 320, and 322 of the impedance inverters 312, 314, and 316 are shown moving from left to right along the line 324 (e.g., Smith line). As depicted, the resistance increases from the impedance inverter 312 to the impedance inverter 314 to the impedance inverter 316 The series of impedance inverters 308 are configured to provide maximum bandwidth while having the lowest possible insertion loss.

Figure 19:
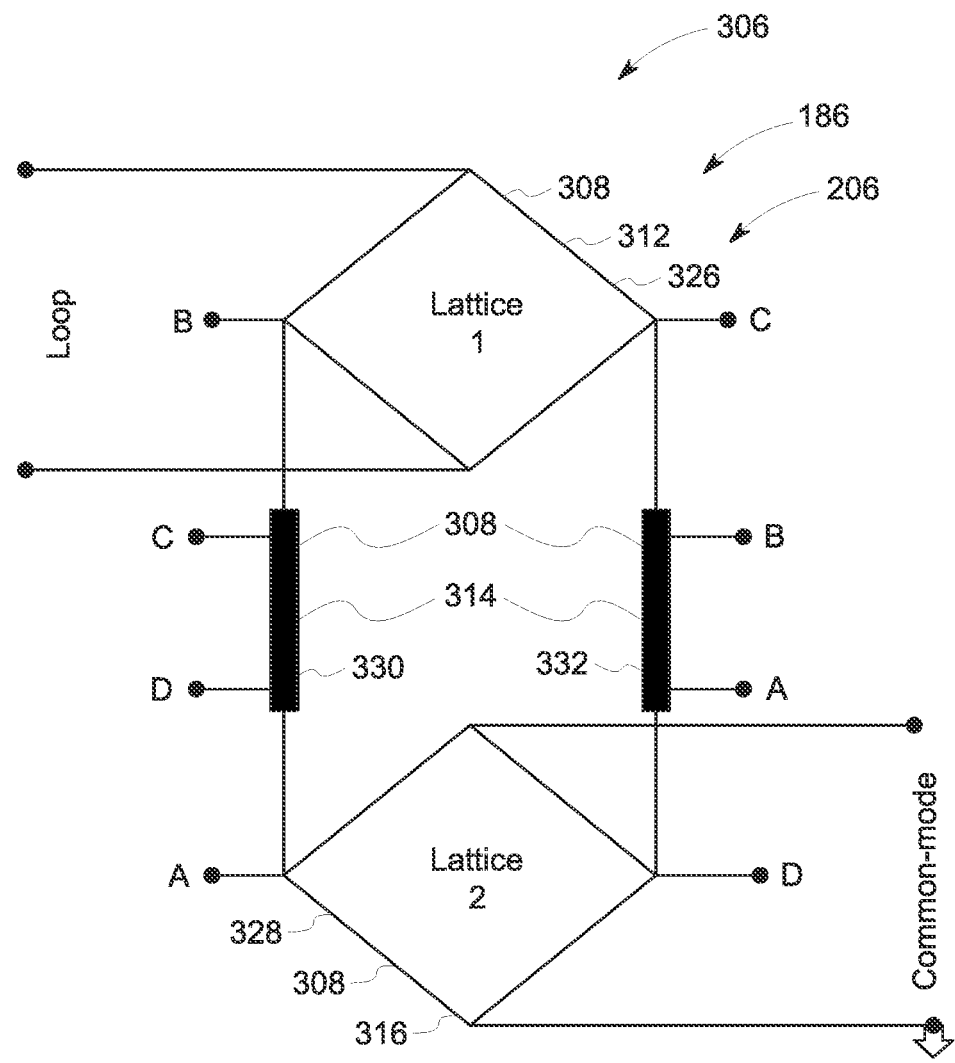
FIG. 19 illustrates a schematic of the series of impedance inverters in FIG. 18, in accordance with aspects of the present disclosure.

FIG. 19 illustrates a schematic of the series of impedance inverters 308 (e.g., of the portion of the preamplifier arrangement 306 in FIG. 18). As depicted in FIG. 19, the impedance inverter 312 includes a lattice balun 326 coupled to the coil element. The impedance inverter 316 also includes a lattice balun 328 coupled to the preamplifier. The impedance inverter 314 includes transmission lines 330 and 332 coupling the lattice balun 326 to the lattice balun 328. Signals through the series of impedance inverters 308 move in the same direction and are outputted from the lattice balun 328.

Figure 20:
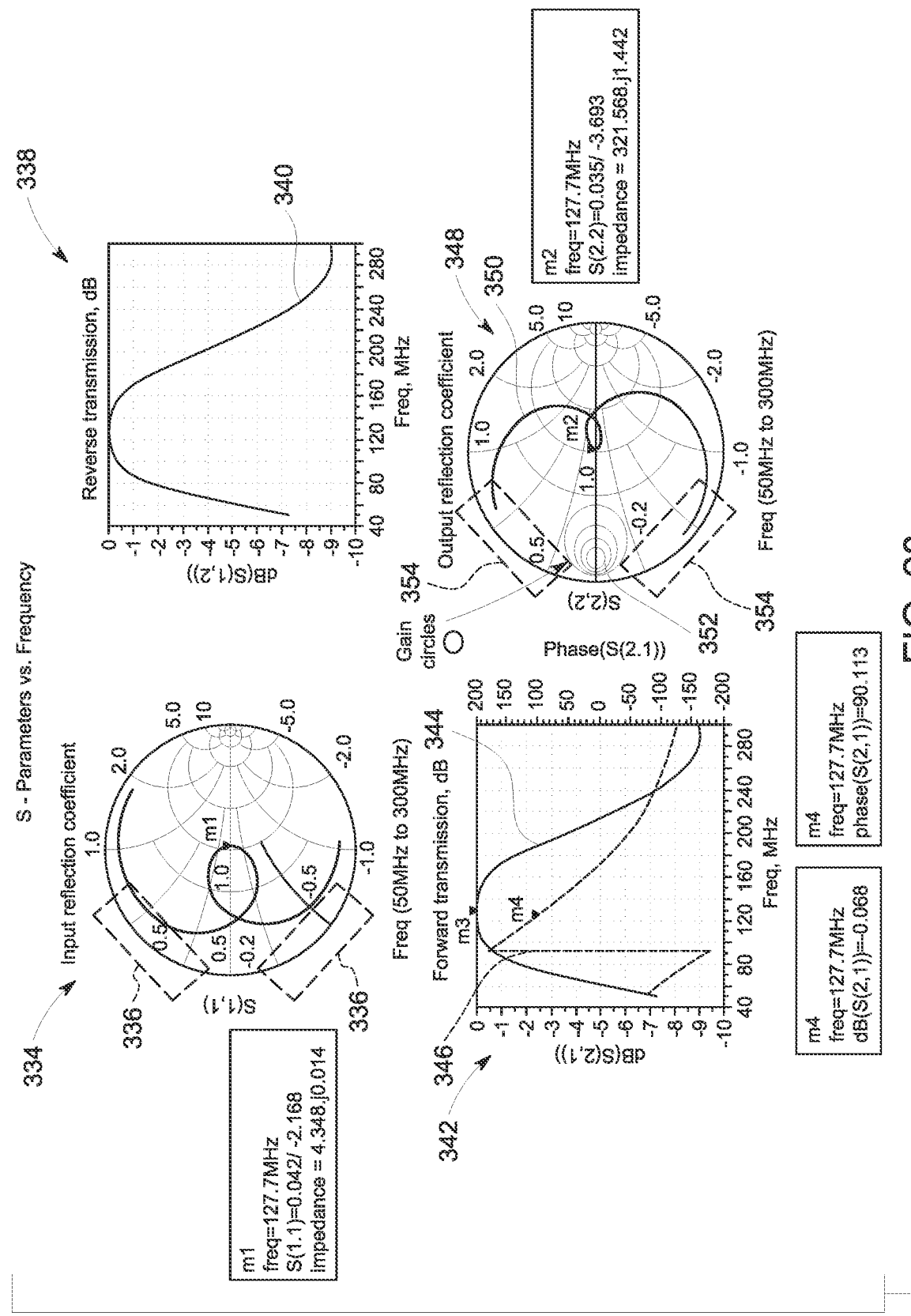
FIG. 20 illustrates different S-parameters versus frequency for the preamplifier arrangement in FIGS. 18 and 19, in accordance with aspects of the present disclosure.

FIG. 20 illustrates different S-parameters versus frequency for the preamplifier arrangement 306 in FIGS. 18 and 19. FIG. 20 illustrates the performance of the input network 206 in FIGS. 18 and 19. The Smith chart 334 in FIG. 20 illustrates the input reflection coefficient 336 due to the input network 206 in FIGS. 18 and 19. The graph 338 in FIG. 20 illustrates the reverse transmission signal 340 due to the input network 206 in FIG. 20. The graph 342 in FIG. 20 illustrates the forward transmission signal 344 and signal 346 (e.g., of the operating frequency) due to the input network 206 in FIG. 20. The Smith chart 348 illustrates the output reflection coefficient 350. The location of the output reflection coefficient 350 are located outside the gain circle 352 with the maximum gain but not greatly removed from the maximum gain. As depicted in the Smith charts 334 and 348, the impedance profile is modified at the output port of the input network 206. In addition, the output reflection coefficient 350 or the output impedance of the input network 206 does not return to loci 354 of impedance regions of interest until the gain has been greatly reduced.

Technical effects of the disclosed embodiments include providing a preamplifier arrangement for an MRI system that includes an input network upstream of a preamplifier reduce coil loop or element gain to assure stability via mismatch-loss and avoiding impedance loci in the near max gain. In particular, the input network provides feedback to reduce or prevent high gain humps that occur with preamplifier decoupling. By the input network lowering feedback and the risk of oscillation, even higher levels of preamp decoupling may be utilized to benefit highly adaptable coils.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

This written description uses examples to disclose the present subject matter, including the best mode, and also to enable any person skilled in the art to practice the subject matter, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A preamplifier arrangement for a magnetic resonance imaging (MRI) system, comprising:
    a preamplifier coupled to a loop of a multi-channel coil array of the MRI system, wherein the preamplifier and the loop are subject to potentially form an unstable system with oscillation at one or more peak frequencies;
    an impedance matching network disposed between and coupled to the preamplifier and the loop, wherein the impedance matching network is configured to generate a high blocking impedance; and
    an input network disposed between and coupled to the preamplifier and the loop, wherein the input network is configured to provide an input to suppress gain at the one or more peak frequencies, and wherein the input network is a distributed input network built-in to the impedance matching network.

2. The preamplifier arrangement of claim 1, wherein the input network comprises a series of impedance inverters.

3. The preamplifier arrangement of claim 2, wherein the series of impedance inverters comprises a first impedance inverter, a second impedance inverter, and a third impedance inverter, and wherein the first impedance inverter comprises a first balun, the second impedance inverter comprises transmission lines, and a third impedance inverter comprises a second balun.

4. The preamplifier arrangement of claim 1, wherein the preamplifier arrangement comprises a plurality of preamplifiers, and each preamplifier of the plurality of preamplifiers is coupled to a different loop of the multi-channel coil array, and each preamplifier coupled to a respective loop is subject to potentially form an unstable system with oscillation at one or more peak frequencies, wherein the input network is disposed between and coupled to each preamplifier and the respective loop each preamplifier is coupled to.

5. A radio frequency (RF) coil assembly for a magnetic resonance imaging (MRI) system, comprising:
    an RF coil comprising a plurality of loops;
    a plurality of preamplifiers, wherein each preamplifier of the plurality of preamplifiers is coupled to a different loop of the plurality of loops, and each preamplifier coupled to a respective loop is subject to potentially form an unstable system with oscillation at one or more peak frequencies;
    an impedance matching network disposed between and coupled to each preamplifier and the respective loop each preamplifier is coupled to, wherein the impedance matching network is configured to generate a high blocking impedance; and
    an input network disposed between and coupled to each preamplifier and the respective loop each preamplifier is coupled to, wherein the input network is configured to provide an input to suppress gain at the one or more peak frequencies, and wherein the input network is a distributed input network built-in to the impedance matching network.

6. The RF receiving coil assembly of claim 5, wherein the input network comprises a series of impedance inverters.

7. A method for suppressing oscillation in a multi-channel coil array of a magnetic resonance imaging (MRI) system, comprising:
    receiving, at a plurality of preamplifiers of the MRI system, magnetic resonance signals from a corresponding plurality of channels of the multi-channel coil array, each preamplifier of the plurality of preamplifiers coupled to a different channel of the plurality of channels, and each preamplifier coupled to a respective channel is subject to potentially form an unstable system with oscillation at one or more peak frequencies; and generating a high blocking impedance via an impedance matching network disposed between and coupled to each preamplifier and corresponding channel; and providing an input to suppress gain at the one or more peak frequencies via an input network disposed between and coupled to each preamplifier and corresponding channel, wherein the input network is a distributed input network built-in to the impedance matching network.

8. A preamplifier arrangement for a magnetic resonance imaging (MRI) system, comprising:

a preamplifier coupled to a loop of a multi-channel coil array of the MRI system, wherein the preamplifier and the loop are subject to potentially form an unstable system with oscillation at one or more peak frequencies;

an impedance matching network disposed between and coupled to the preamplifier and the loop, wherein the impedance matching network is configured to generate a high blocking impedance; and an input network disposed between and coupled to the preamplifier and the loop, wherein the input network is configured to provide an input to suppress gain at the one or more peak frequencies, wherein the input network is separate from the impedance matching network, the input network comprises a series inductor-capacitor network, and wherein the preamplifier arrangement comprises a stability compensation circuit disposed between and coupled to the loop and the series inductor-capacitor network.

* * * * *